United States Patent
Campbell et al.

(10) Patent No.: US 7,375,962 B2
(45) Date of Patent: *May 20, 2008

(54) JET ORIFICE PLATE WITH PROJECTING JET ORIFICE STRUCTURES FOR DIRECT IMPINGEMENT COOLING APPARATUS

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhineback, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/940,482

(22) Filed: Nov. 15, 2007

(65) Prior Publication Data

US 2008/0062639 A1 Mar. 13, 2008

Related U.S. Application Data

(63) Continuation of application No. 11/462,735, filed on Aug. 7, 2006.

(51) Int. Cl.
*H05K 7/20* (2006.01)
*H01L 23/24* (2006.01)
*F28D 15/00* (2006.01)

(52) U.S. Cl. .................... 361/699; 361/718; 165/80.4; 165/104.33; 165/908; 257/714

(58) Field of Classification Search ........ 361/699–703, 361/718; 165/80.4–80.5, 104.33, 908
See application file for complete search history.

(56) References Cited

U.S. PATENT DOCUMENTS 3,109,485 A 11/1963 Fortier (Continued)

OTHER PUBLICATIONS

"Direct Liquid Jet Impingement Modules dor High Heat Flux Electronics Packages", Campbell et al., U.S. Appl. No. 11/427,380, filed Jun. 29, 2006.

*Primary Examiner*—Jayprakash N Gandhi
*Assistant Examiner*—Robert J Hoffberg
(74) *Attorney, Agent, or Firm*—Lily Neff, Esq.; Kevin P. Radigan, Esq.; Heslin Rothenberg Farley & Mesisti, P.C.

(57) ABSTRACT

A cooling apparatus and a direct cooling impingement module are provided, along with a method of fabrication thereof. The cooling apparatus and direct impingement cooling module include a manifold structure and a jet orifice plate for injecting coolant onto a surface to be cooled. The jet orifice plate, which includes a plurality of jet orifices for directing coolant at the surface to be cooled, is a unitary plate configured with a plurality of jet orifice structures. Each jet orifice structure projects from a lower surface of the jet orifice plate towards the surface to be cooled, and includes a respective jet orifice. The jet orifice structures are spaced to define coolant effluent removal regions therebetween which facilitate removal of coolant effluent from over a center region of the electronic component being cooled to a peripheral region thereof, thereby reducing pressure drop across the jet orifice plate.

17 Claims, 8 Drawing Sheets

U.S. PATENT DOCUMENTS

| | | |
|---|---|---|
| 4,064,300 A | 12/1977 | Bhangu |
| 4,108,242 A | 8/1978 | Searight et al. |
| 4,201,195 A | 5/1980 | Sakhuja |
| 4,622,946 A | 11/1986 | Hurley et al. |
| 4,750,086 A | 6/1988 | Mittal |
| 5,063,476 A | 11/1991 | Hamadah et al. |
| 5,126,919 A | 6/1992 | Yamamoto et al. |
| 5,183,104 A | 2/1993 | Novotny |
| 5,220,804 A | 6/1993 | Tilton et al. |
| 5,349,831 A | 9/1994 | Daikoku et al. |
| 5,718,117 A | 2/1998 | McDunn et al. |
| 5,854,092 A | 12/1998 | Root et al. |
| 6,000,908 A | 12/1999 | Bunker |
| 6,366,462 B1 | 4/2002 | Chu et al. |
| 6,378,605 B1 | 4/2002 | Kutscher et al. |
| 6,431,260 B1 | 8/2002 | Agonafer et al. |
| 6,519,151 B2 | 2/2003 | Chu et al. |
| 6,571,569 B1 | 6/2003 | Rini et al. |
| 7,079,393 B2 | 7/2006 | Colgan et al. |
| 2002/0062945 A1 | 5/2002 | Hocker et al. |
| 2006/0162365 A1 | 7/2006 | Hoang et al. |

JET ORIFICE PLATE WITH PROJECTING JET ORIFICE STRUCTURES FOR DIRECT IMPINGEMENT COOLING APPARATUS

CROSS REFERENCE TO RELATED PATENT/APPLICATION

This application is a continuation of U.S. patent application Ser. No. 11/462,735, filed Aug. 7, 2006, and entitled "Jet Orifice Plate with Projecting Jet Orifice Structures for Direct Impingement Cooling Apparatus", by Campbell et al., which is hereby incorporated herein by reference in its entirety. Further, this application contains subject matter which is related to the subject matter of the following patents/applications, each of which is assigned to the same assignee as this application and both of which are hereby incorporated herein by reference in its entirety:

"Direct Liquid Jet Impingement Modules for High Heat Flux Electronics Packages", Campbell et al., U.S. Ser. No. 11/427,380, filed Jun. 29, 2006; and "Fluidic Cooling Systems and Methods for Electronic Components", Colgan et al., U.S. Pat. No. 7,079,393 B2, issued Jul. 18, 2006.

TECHNICAL FIELD

The present invention relates in general to heat transfer mechanisms, and more particularly, to cooling apparatuses, cooling modules and methods of fabrication thereof for removing heat generated by one or more electronic components. Still more particularly, the present invention relates to fluidic cooling apparatuses and methods for cooling one or more electronic components via direct coolant impingement employing a jet orifice plate.

BACKGROUND OF THE INVENTION

The industry trend has been to continuously increase the number of electronic components within computing system environments. Compactness allows for selective fabrication of smaller and lighter devices that are more attractive to the consumer. Compactness also allows circuits to operate at higher frequencies and at higher speeds due to the shorter electrical connection distances in these devices. Despite these advantages, providing many electronic components in a small footprint can create device performance challenges. One challenge has to do with thermal management of the overall environment. Heat dissipation, if unresolved, can result in electronic and mechanical failures that will affect overall system performance, irrespective of the size of the environment.

In many computing environments, microprocessors of the computing environment continue to increase in performance, with the active circuitry of the microprocessor chip being driven to an ever smaller footprint and higher power dissipation. Higher power dissipation in a smaller footprint leads to high heat loads and high heat fluxes. Notwithstanding this, reliability constraints often dictate that operating temperature of the devices not exceed a known maximum value.

The existing art has struggled with designing high-performance cooling solutions that can efficiently remove this heat. Current cooling solutions depend on conduction cooling through one or more thermal interfaces to an air-cooled heat sink, possibly employing a spreader or vapor chamber. To further increase the heat removal capability of air-cooled systems, greater airflow is needed. Unfortunately, providing greater airflow is not always possible. Many factors must be taken into consideration in providing ever greater airflow, among which are acoustic noise considerations, as well as power concerns.

As an alternative, liquid cooling methods have recently been incorporated into certain designs. Liquid cooling, however, is also limited by several factors. Liquid cooled microprocessors in the existing art are either immersion cooled in a dielectric fluid (for cooling by pool boiling), or incorporate a cold plate design. Immersion cooled modules have the limitation that the critical heat flux of the dielectric coolant employed is relatively low, thereby limiting the acceptable chip heat flux. Cold plate cooled modules have the limitation that intermediate materials and interfaces restrict the heat transfer capabilities of the module. Consequently, a need still remains for enhanced high performance cooling solutions for cooling high heat flux electronic components.

SUMMARY OF THE INVENTION

The shortcomings of the prior art are overcome and additional advantages are provided through the provision, in one aspect, of a cooling apparatus comprising a manifold structure and including a jet orifice plate for injecting coolant onto a surface to be cooled when the cooling apparatus is employed to cool at least one electronic component. The jet orifice plate, which includes a plurality of jet orifices for directing coolant at the at least one electronic component to be cooled, is configured with a plurality of jet orifice structures. Each jet orifice structure projects from a first surface of the jet orifice plate towards the surface to be cooled, and includes a respective jet orifice of the plurality of jet orifices. The plurality of jet orifice structures are spaced to define coolant effluent removal regions therebetween which facilitate removal of coolant effluent from over a center region of the at least one electronic component to a peripheral region thereof when the cooling apparatus is employed to cool the at least one electronic component, and thereby reduce pressure drop across the jet orifice plate.

In another aspect, a direct impingement cooling module is provided which includes a frame, a manifold and a jet orifice plate. The frame includes a frame opening configured to align over at least one electronic component to be cooled, and the manifold is disposed over the frame and has an inlet manifold opening and an outlet manifold opening. The inlet manifold opening is in fluid communication with a manifold inlet for supplying coolant, and the outlet manifold opening is in fluid communication with a manifold outlet for removing coolant effluent. The inlet manifold opening is aligned over the frame opening. The jet orifice plate is associated with the manifold and is aligned over the inlet manifold opening. The jet orifice plate includes a plurality of jet orifices for directing coolant at the at least one electronic component to be cooled. The jet orifice plate is a unitary plate configured with a plurality of jet orifice structures. Each jet orifice structure projects from a first surface of the jet orifice plate towards the at least one electronic component to be cooled. The plurality of jet orifice structures are spaced to define coolant effluent removal regions therebetween which facilitate removal of coolant effluent from over a center region of the at least one electronic component to a peripheral region thereof, for removal through the outlet manifold opening of the manifold, thereby reducing coolant pressure drop across the jet orifice plate.

In a further aspect, a method of fabricating a cooled electronic module is provided. The method includes: providing a substrate with at least one electronic component coupled to a surface of the substrate; and providing a cooling apparatus for cooling the at least one electronic component. Providing the cooling apparatus includes: providing a frame having a frame opening configured to align over the at least one electronic component to be cooled; providing a manifold disposed over the frame and having an inlet manifold opening and an outlet manifold opening, the inlet manifold opening being in fluid communication with a manifold inlet for supplying coolant, and the outlet manifold opening being in fluid communication with an manifold outlet for removing coolant effluent, the inlet manifold opening being aligned over the frame opening; and providing a jet orifice plate associated with the manifold and aligned over the inlet manifold opening. The jet orifice plate comprises a plurality of jet orifices for directing coolant at the at least one electronic component to be cooled, and is a unitary plate configured with a plurality of jet orifice structures. Each jet orifice structure projects from a lower surface of the jet orifice plate towards the at least one electronic component to be cooled. The plurality of jet orifice structures are spaced to define coolant effluent removal regions therebetween which facilitate removal of coolant effluent from over a center region of the at least one electronic component to a peripheral region thereof for removal through the outlet manifold opening, thereby reducing pressure drop across the jet orifice plate. The method further includes coupling the frame to the substrate and providing a coolant-tight seal around the at least one electronic component to be cooled, wherein the plurality of jet orifices inject a plurality of coolant jets for direct impingement on a surface of the at least one electronic component to be cooled.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronic component" comprises any heat generating electronic component of a computer system or other electronic system requiring cooling. In one example, the electronic component is or includes an integrated circuit chip, a semiconductor chip and/or any other electronic device requiring cooling. The term "cooled electronic module" includes any electronic module with direct or indirect cooling of an electronic component, with cooled single-chip modules and cooled multi-chip modules being examples of cooled electronic modules as described herein. In one embodiment, the cooled electronic module employs direct coolant impingement on the surface to be cooled, and is referred to herein as a "direct impingement cooling module". The "surface to be cooled" refers to a surface of the electronic component itself, or to an exposed surface of a thermal cap, thermal spreader, passivation layer, or other surface in contact with the electronic component, and through which heat generated by the electronic component is to be extracted.

As noted, provided herein are enhanced cooling apparatuses and methods of fabrication which allow for high heat transfer from a surface of an electronic component to be cooled using a direct (or indirect) liquid coolant impingement approach. In one embodiment, the cooling liquid comprises a water-based, single-phase coolant. However, the concepts disclosed herein are readily adapted to use with other types of coolant, either single-phase or two-phase. For example, the coolant may comprise a brine, a fluorocarbon liquid, a liquid metal, or other similar coolant, or refrigerant, while still maintaining the advantages and unique features of the present invention.

As noted above, performance of computers continues to increase in both speed and function. Heat dissipated by electronic devices, and in particular, processor chips, is increasing correspondingly. Processor chips with an average heat flux of more than 100 W/cm$^2$ and a "hotspot" heat flux approaching 300 W/cm$^2$ are already being considered, and within the next few years these heat flux levels could approach 200 and 450 W/cm², respectively. The chip heat loads under consideration already exceed the capability of even the most effective air cooling apparatuses. Projected chip heat loads are likely even to exceed the capability of water cooling approaches with a cold plate attached at either the module or chip level.

Figure 1:
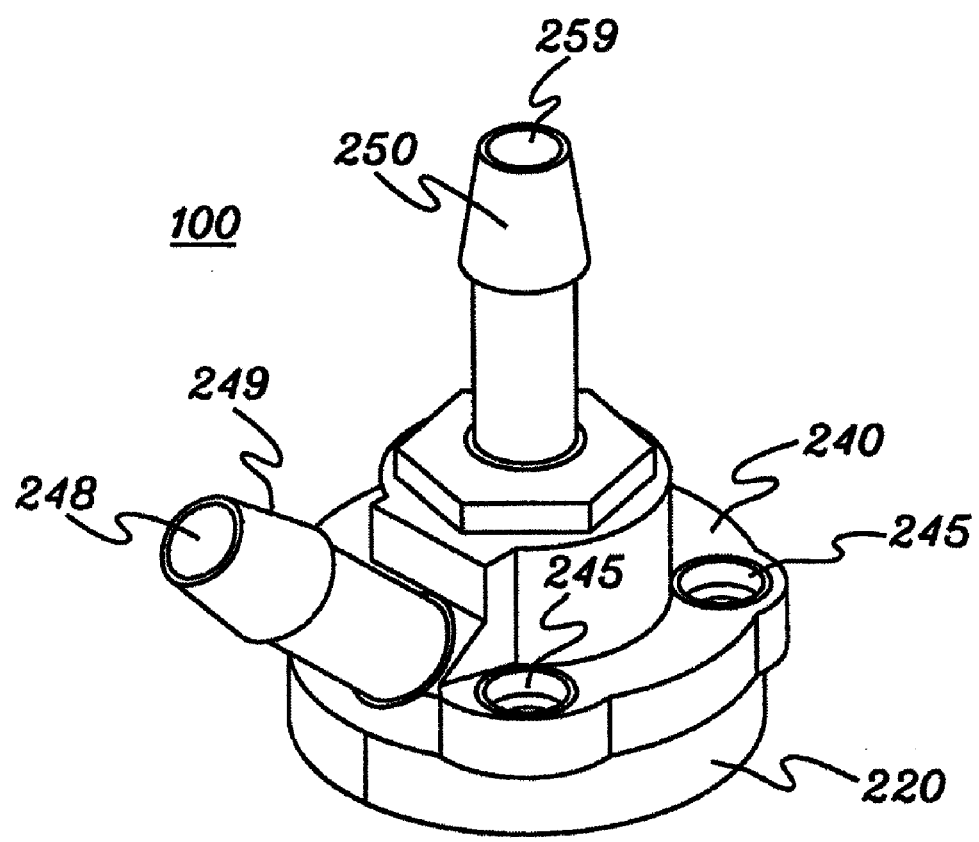
FIG. 1 is an isometric illustration of one embodiment of a direct impingement cooling module, in accordance with an aspect of the present invention.

One cooling solution which meets junction temperature requirements at these levels of heat flux is water-cooling in direct contact with the back surface of the electronic component to be cooled. FIG. 1 depicts one embodiment of a cooled electronic module 100 employing direct jet impingement of coolant onto the surface to be cooled (and being alternatively referred to herein as a direct impingement cooling module). The high heat transfer coefficients obtainable in a direct impingement approach make this an especially attractive cooling option for high heat flux electronic packages.

One reason for this is that impinging liquid jets directly onto electronic components is an effective means of providing high heat transfer rates. When a liquid jet strikes a surface, thin hydrodynamic and thermal boundary layers are formed in the region located directly beneath the jet. Thereafter, the flow is forced to accelerate in a direction parallel to the cooled surface, referred to herein as the surface to be cooled. This accelerated flow is directed in what is termed the wall jet or parallel flow zone.

The thickness of the hydrodynamic and thermal boundary layers in the stagnation region may be on the order of micrometers. Because of this, very high heat transfer coefficients exist in the stagnation zone directly under the jet. Heat transfer coefficients characteristic of parallel flow prevail in the wall jet region. These high heat transfer coefficients make liquid jet impingement an attractive cooling option for thermal control of high-heat-dissipation electronic components.

In addition to the isometric view of FIG. 1, the components of cooled electronic module 100 are shown in exploded view in FIG. 2, with cooled electronic module 100 being described hereinbelow with collective reference to both FIGS. 1 & 2.

Figure 2:
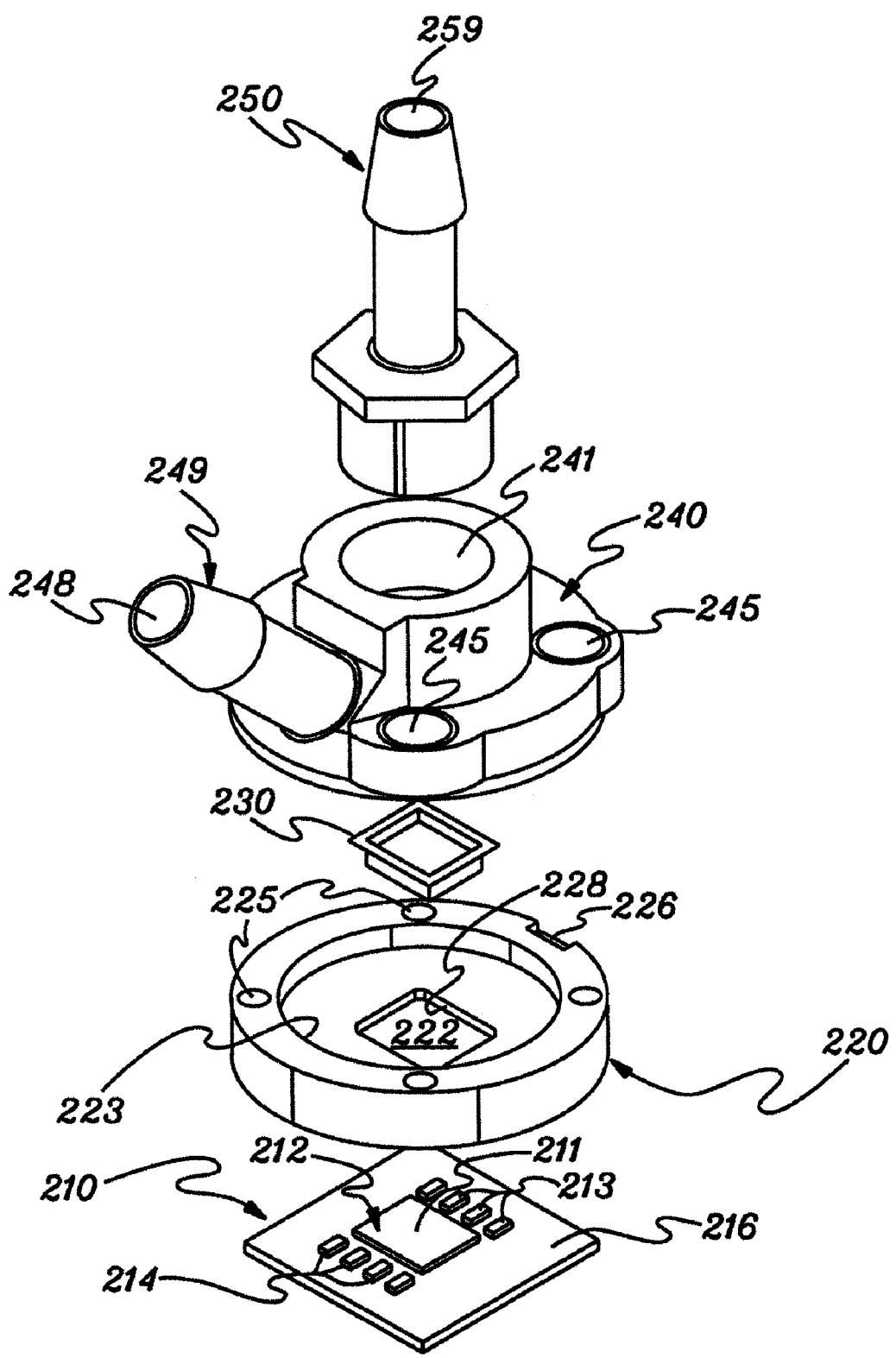
FIG. 2 is an exploded view of the cooling module of FIG. 1, in accordance with an aspect of the present invention.

The cooled electronic module 100 includes a to-be-cooled electronics package 210 (FIG. 2). Electronics package 210, in one embodiment, includes a single-chip module (SCM) package 212 and one or more discrete devices 214, such as one or more capacitors, resistors, and/or memory devices or other discrete electronics devices. Integrated circuit chip 212 is one example of an electronics component to be cooled.

As shown in FIG. 2, both integrated circuit chip 212 and discrete device(s) 214 are secured to a component carrier 216. Integrated circuit chip 212 can have a high heat flux level, generating a large amount of heat from a small surface area. For example, integrated circuit chip 212 might have a heat flux level exceeding 250 W/cm².

Integrated circuit chip 212 and discrete devices 214 have back surfaces 211 and 213, respectively, and upper surfaces (not visible in the viewed depiction). The upper surfaces of the integrated circuit chip and the discrete device(s) 214 can be secured to the component carrier's 216 surface or other such similar surface by a variety of ways known to those skilled in the art. In the example of FIG. 2, integrated circuit chip 212 and discrete devices 214 are secured to component carrier 216 by one or more solder connections (not illustrated), with the integrated circuit chip 212 and discrete device(s) 214 in electrical communication. Solder connections between component carrier 216 and integrated circuit chip 212 and discrete device(s) 214 can also be encapsulated, for example with epoxy, to reduce stress on solder connections due to thermal expansion mismatch between integrated circuit chip 212 and component carrier 216.

In the embodiment of FIG. 2, integrated circuit chip 212 has a generally polygonal shape defined by a plurality of sides which join back surface 211 to the upper surface (not illustrated). In the illustrated embodiment, integrated circuit chip 212 is shown to have a rectangular shape, but other shapes (including non-polygons) can be used if desired.

A frame 220 is also provided as depicted in FIG. 2. Frame 220 (in the depicted embodiment) has an annular shape to enable ready incorporation into cooled electronics module 100 and easy attachment to other components used in cooled electronics module 100. Frame 220 has a thickness illustrated and referenced by numeral 223, and in the embodiment shown, provides adequate surface area for a vertical annular (o-ring) seal (not shown), which fastens and seals a manifold 240 to frame 220. It should also be noted, that the annular shape of the seal/frame is not a requirement and is only provided for process flexibility and facility of assembly with commonly available components. The frame shape, therefore, can be selectively altered to suit other needs.

Frame 220 also comprises (in one embodiment) a centrally located opening 222. A matching seal member 310 (see FIG. 3A) is provided and formed around integrated circuit chip 212 to prevent leakage of coolant to other adjacent areas. In one embodiment, the matching seal member is annular in shape and disposed to prevent coolant from reaching chip C4s or other surfaces, such as substrate top surface metallurgy. The particulars of one embodiment of the sealing member can be found in the above-incorporated U.S. Pat. No. 7,070,393, entitled "Fluidic Cooling Systems and Methods for Electronic Components". In such a case, however, the frame is connected to component carrier 216 so that the annular area is defined between opening 222 and the one or more electronic components (212/214) to be cooled.

It should be noted that the placement and shape of opening 222 can be altered; for example, based on the shape of frame 220, or other factors such as the placement of the electronics component to be cooled. Regardless of shape and position of opening 222, the enumerated matching sealing member is used to ensure jet impingement only on the surface(s) to be cooled of the electronic component. In one embodiment, the sealing member and frame in conjunction with one another are designed to prevent coolant from contacting capacitors 214, as well as I/O connectors securing the chip and other devices to component carrier 216.

As noted, opening 222 is sized and aligned to receive integrated circuit chip 212 for facilitating direct liquid impingement cooling once the module is assembled as shown in FIG. 1. In one embodiment, opening 222 is formed to create a secure fit over integrated circuit chip 212 once the sealing member is in place. The shape of opening 222 can be identical to that of integrated circuit chip 212, with the perimeter of opening 222 being slightly larger than that of integrated circuit chip 212 (with sides 228 of the orifice being slightly longer than integrated circuit chip 212 sides). In such a case, once the frame is placed over integrated circuit chip 212, the jet impingement is focused and directed towards surface 211 of integrated circuit chip 212 alone.

In alternate embodiments, it is possible to form a larger opening, with appropriate sealing members to include a different topology or a larger area of component carrier 216, if desired. It is even possible to have opening 222 and appropriate sealing members accommodate the entire component carrier 216.

Alternatively, it is possible to have a plurality of orifices, only one of which is illustrated in FIG. 2 as discussed. In an embodiment where frame 220 houses multiple orifices, each orifice can be sized and shaped differently if desired; for example, to fit over one integrated circuit chip, or to securely fit over adjacent electronic components as well. In this case more than one sealing member may be used and fitted within the plurality of orifices, in order to prevent coolant leakage to unwanted areas.

Frame 220 can be secured to manifold 240 or other elements in the computing environment in a variety of ways known to those skilled in the art. It should be noted that in certain embodiments, frame 220 is attached to the substrate 216 to establish the (annular) seal. The subassembly can then be secured to manifold 240. Thereafter, the inlet fitting to the manifold can be shaped. For example a single pipe can be molded to act both as the inlet and outlet fitting. Furthermore, in the example provided in FIG. 2, a plurality of attachment components 225 and 226 are employed. The attachment components are fabricated to align with counterpart alignment components in manifold 240 or other such surfaces. In the example depicted, alignment components 225 are a series of circular openings or holes, through which a screw or pin is driven to ensure proper attachment and securing of the frame to other components. Alternatively, the fastening means can be replaced by mechanical means such as a clamp in order to hold the parts more securely together. Alignment component 226 is different in shape, having an elongated surface, and can be securely fit into an alignment counterpart to attach frame 220 securely to manifold 240. Use of epoxy or other securing means can also be used to further ensure proper attachment of frame 220 to manifold 240 or other such components in the computing environment.

Manifold 240 includes a jet orifice plate 230. Jet orifice plate 230 is provided to control impingement of fluid onto the back surface of the die. Consequently, jet orifice plate 230 is aligned with opening 222 once assembled. In one embodiment, jet orifice plate 230 is molded into manifold 240, even though, shown separately in FIG. 2 for ease of understanding.

Manifold 240 comprises an opening 241 which is complementarily shaped with the inlet fitting 250. Once manifold 240 is disposed over frame 220, manifold opening 241 and frame orifice 220 are aligned. As discussed above, jet orifice plate 230 is also housed in manifold 240 so that once manifold 240 is disposed over frame 220, jet orifice plate 230 is aligned directly over frame opening 222.

Manifold opening 241 also comprises an inlet manifold or plenum for providing coolant for direct liquid impingement on integrated circuit chip 212. The spray area comprises two portions. A first portion accommodates inlet fitting 250 into manifold 240. The coolant will be provided through a manifold inlet 259 in inlet fitting 250. Liquid coolant then traverses the inlet manifold opening and passes through orifice plate 230 onto the surface to be cooled of integrated circuit chip 212.

Manifold 240 also comprises an outlet fitting 249 that can be molded during the same process step as the manifold itself. Outlet fitting 249 can be integral to manifold 240 or it can be a separate entity that is secured to manifold 240 though attachments as will be appreciated by those skilled in the art. In one embodiment, the manifold can be formed from plastic and molded to a desired shape.

As discussed above, attachment components referenced as 245 are provided on manifold 240, and are aligned with the ones provided on the frame (discussed above as reference numeral 225) to ensure proper attachment and securing of manifold 240 to frame 220. A variety of techniques known to those skilled in the art can be used to accommodate the attachment. For example, a combination of screws and pins used in conjunction with epoxy could be used in one embodiment.

In addition, and as noted above, manifold 240 is fluidly sealed to the frame by another sealing member (not viewable in FIG. 1 or 2). For example, this other sealing member might be an o-ring seal provided on the vertical surface of the frame 220.

As illustrated, manifold 240 is shaped to receive inlet fitting 250 (for receiving fluid coolant flow) and outlet fitting 249 (for removing dissipated heat in all forms (such as vapor) from the electronic component (212) after jet impingement). The inlet and outlet fittings 250 and 249 are also ultimately attached to complementary components, such as coolant supply unit (for example) to enable the flow of coolants into the module and the removal of coolant effluent. Appropriately placed sealing members can be used in conjunction with the inlet fitting 250 (or alternatively outlet fitting 249) to prevent fluid leaking to unwanted areas of the computing environment.

Further details of a direct impingement cooled electronics module are provided in the above-incorporated co-pending application entitled "Direct Liquid Jet Impingement Module for High Heat Flux Electronics Packages".

Figure 3:
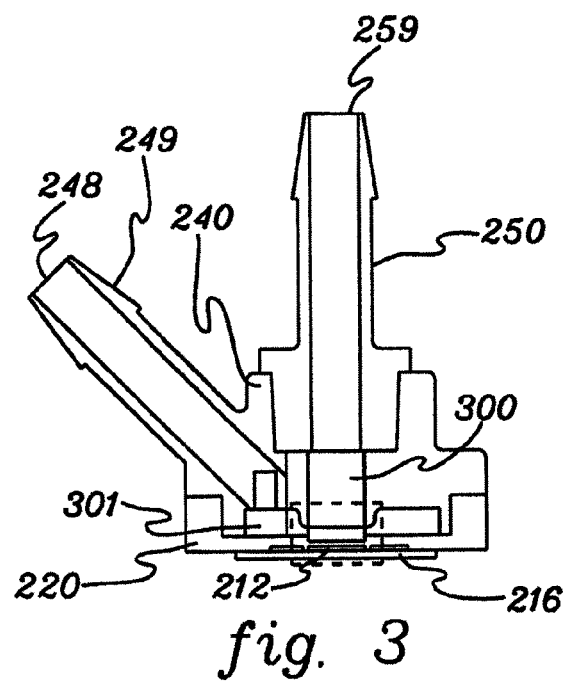
FIG. 3 is a cross-sectional elevational view of the cooling module of FIGS. 1 & 2, in accordance with an aspect of the present invention.
Figure 3A:
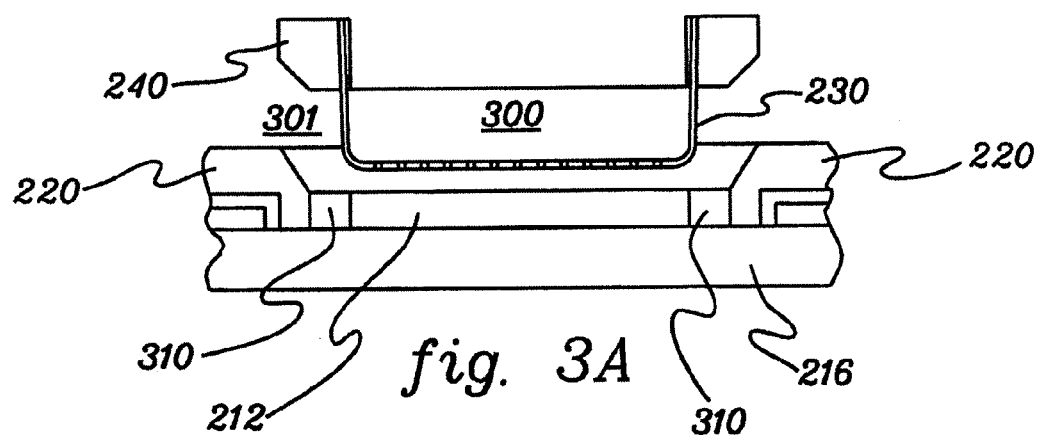
FIG. 3A is a partial enlarged illustration of FIG. 3 showing one embodiment of the jet orifice plate aligned over the electronic component to be cooled via direct coolant impingement on a surface thereof, in accordance with an aspect of the present invention.

As noted, in one aspect, the present application is directed to enhancements to a jet orifice plate; for example, for use within a cooled electronic module such as described above. FIGS. 3 & 3A depict cross-sectional elevational views of the cooled electronic module described above in connection with FIGS. 1 & 2.

As noted, cooled electronics module 100 includes frame 220, such as a ceramic frame, having an opening sized to receive at least one electronic component, such as an integrated circuit chip 212. As shown in FIG. 3A, frame 220 is secured to substrate 216, which supports integrated circuit chip 212, and a fluid-tight seal 310, such as an annular seal, is provided around the periphery of the integrated circuit chip. Coolant is fed through a manifold inlet 259 to an inlet manifold opening 300 in fluid communication therewith provided in manifold 240. Inlet manifold opening 300 is aligned over the surface to be cooled, such as the exposed back surface 211 (see FIG. 2) of integrated circuit chip 212. Manifold 240 further includes an outlet manifold opening 301 in fluid communication with a manifold outlet 248 of outlet fitting 249 for removing coolant effluent after direct impingement on the surface to be cooled. Jet orifice plate 230 is associated with manifold 240 and is aligned over inlet manifold opening 300. In the embodiment shown, jet orifice plate 230 has a flat jet orifice plate configuration at its base.

Figure 4:
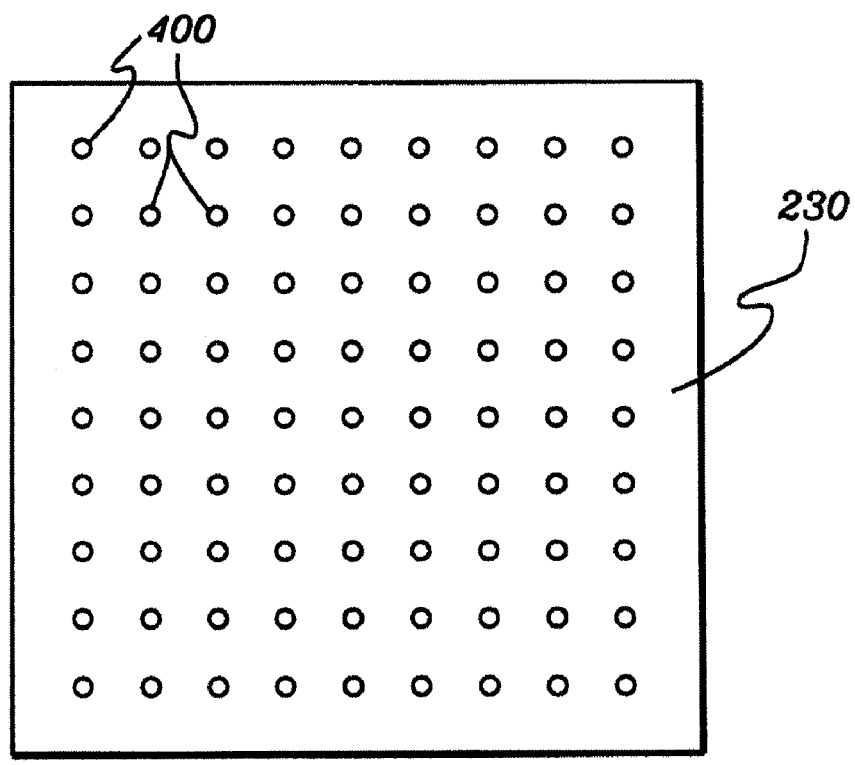
FIG. 4 is a plan view of one embodiment of a jet orifice plate, in accordance with an aspect of the present invention.
Figure 4A:
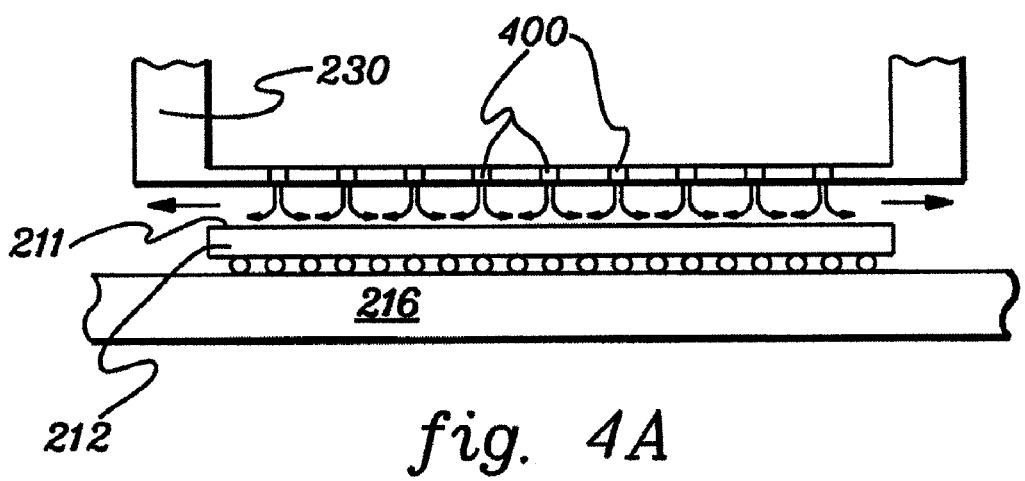
FIG. 4A is a partial cross-sectional elevational view of a direct impingement cooling module illustrating direct jet impingement of coolant onto a surface of the electronics component to be cooled, in accordance with an aspect of the present invention.

FIGS. 4 & 4A depict further details of the flat jet orifice plate. As shown in FIG. 4, in one embodiment, jet orifice plate 230 has a rectangular base surface area and includes an array of jet orifices 400 disposed to inject coolant via direct jet impingement onto the back surface 211 of the integrated circuit chip 212 to be cooled (see FIG. 4A). Although not shown, appropriate seals are provided around the one or more electronic components to be cooled (e.g., integrated circuit chip 212) isolating the active circuitry portion of the electronic components coupled to substrate 216 from the coolant impinging on the back surface of the electronic components. As shown by the coolant injection arrows of FIG. 4A, coolant jets strike the surface to be cooled 211 and then spreads radially outwards from the point of impact.

Figure 5:
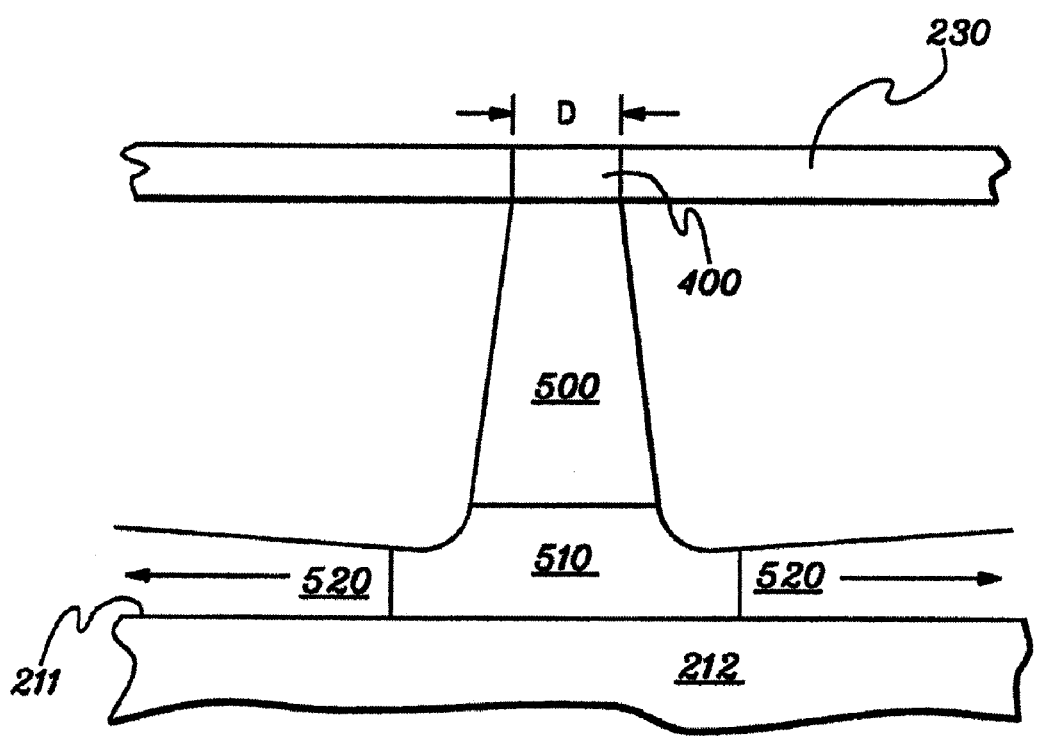
FIG. 5 is a schematic representation of certain regions of the flow field established from direct impingement of a liquid onto a surface within a direct impingement cooling module, in accordance with an aspect of the present invention.

FIG. 5 illustrates one embodiment of a flow field established from direct impingement of coolant onto a surface. As shown, jet orifice plate 230 is spaced from surface to be cooled 211 of the electronic component (e.g., integrated circuit chip 212), and through an orifice 400 in jet orifice plate 230 a coolant jet is directed at the surface to be cooled. Once operational, a free jet region 500 is established in the immediate vicinity of jet orifice 400. Closer to the surface to be cooled 211 a stagnation region 510 is produced, and circumferentially therefrom a walled jet region 520 extends. As will be appreciated by those skilled in the art, FIG. 5 represents an ideal flow field for transfer of heat from the surface to be cooled to the coolant using jet impingement.

One issue with the approach illustrated in FIGS. 3-4A is the occurrence of a wash effect. For example, a wash effect occurs when the effluent flow from orifices in the jet array interior interfere with the jet flow field associated with one or more of the peripheral orifices. Analysis has shown that the flow field in the jet stagnation zone where heat transfer is highest can be perturbed in the peripheral flow fields resulting in degraded thermal performance. Pressure drop is also adversely affected, particularly as the jet plate is positioned closer and closer to the impingement surface. Several factors affect this behavior. The number of jets in the array, the coolant flow rate and the jet orifice height above the impingement surface all contribute to the wash effect. Notwithstanding this, the operational goal is to further increase thermal performance by, for example, providing a greater number of impingement jets, a higher flow rate, and a shorter distance between the jet orifices and the surface to be cooled, all of which increase the potential wash effect.

Figure 6:
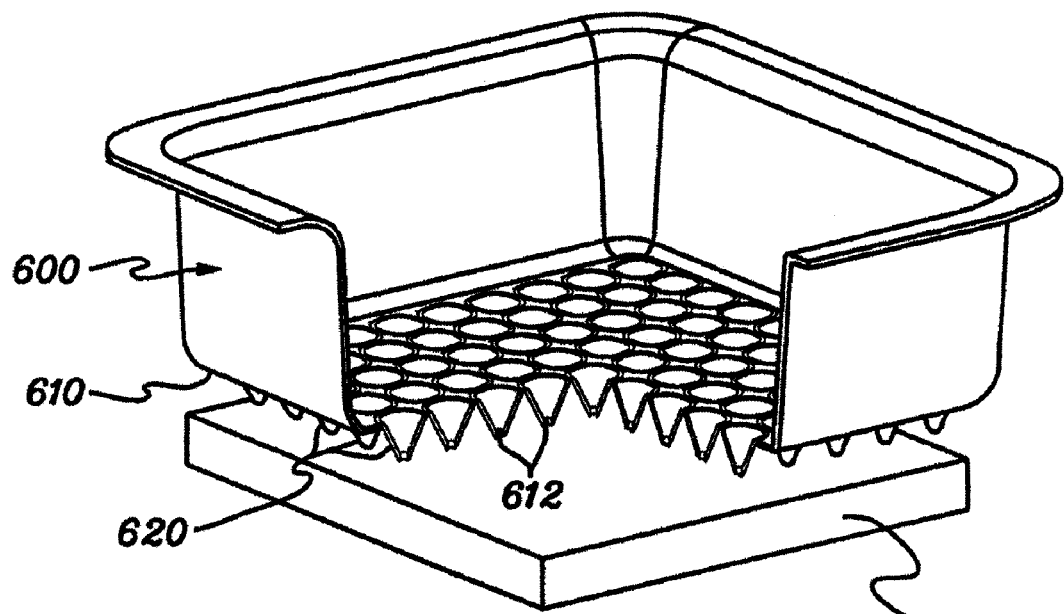
FIG. 6 is a partially cut-away isometric view of an alternate embodiment of a jet orifice plate having a plurality of jet orifice structures projecting from a lower surface thereof, and shown disposed over an electronic component to be cooled, in accordance with an aspect of the present invention.
Figure 7:
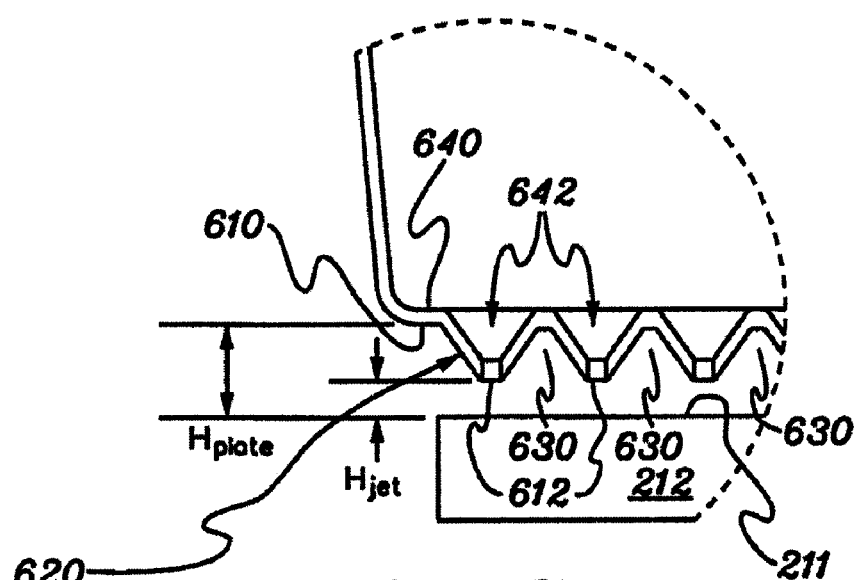
FIG. 7 is a partial elevational view of the jet orifice plate and electronic component of FIG. 6, illustrating the distance between the jet orifices and the surface to be cooled, as well as the distance between the lower surface of the jet orifice plate and the surface to be cooled in the coolant effluent removal regions defined between the plurality of jet orifice structures, in accordance with an aspect of the present invention.

FIGS. 6 & 7 depict one embodiment of a jet orifice plate 600 (alternatively referred to herein as a structured jet orifice plate) configured to eliminate the potential wash effect. Jet orifice plate 600 includes a first surface 610 (e.g., a lower surface of the base), with a plurality of jet orifices 612 arrayed across the first surface of the jet orifice plate. The jet orifice plate comprises a unitary base plate formed, for example, by stamping a metal plate such as a stainless steel, copper or tungsten plate, to produce a plurality of jet orifice structures 620. In this embodiment, the plurality of jet orifice structures 620 project in a uniform array across the lower surface of the jet orifice plate 600 and have a common geometrical configuration, i.e., a conical configuration.

The plurality of jet orifice structures 620 are spaced to define coolant effluent removal regions 630 therebetween which facilitate removal of coolant effluent from over a center region of the at least one electronic component to a peripheral region thereof, thereby reducing or eliminating the wash effect, and reducing coolant pressure drop across the jet orifice plate. As shown in the figure, a second surface 640 (e.g., an upper surface of the base) of jet orifice plate 600 comprises a plurality of funnels 642 formed by the plurality of jet orifice structures 620 of conical configuration projecting from first surface 610 of jet orifice plate 600. Through testing and analysis, the coolant effluent removal regions are preferably sized to fully accommodate coolant effluent exhausting over the center region of the at least one electronic component, thereby preventing the effluent from perturbing flow fields of coolant injected onto the surface to be cooled in either the center region or a peripheral region of the at least one electronic component. Further, the coolant effluent removal regions could advantageously be employed in a two-phase coolant approach to facilitate removal of coolant vapor from over the center region of the at least one electronic component to the peripheral region thereof.

As best shown in FIG. 7, the structured jet orifice plate is placed relatively close to the surface to be cooled, but still provides a larger effluent flow space than would be provided by a conventional flat jet orifice plate such depicted in FIGS. 3-4A; that is, assuming that the plurality of jet orifices were disposed at a common height from the impingement surface.

As shown in the example of FIG. 7, the plurality of jet orifices 612 are disposed at a height $H_{jet}$ above the surface to be cooled 211 of the integrated circuit chip 212. In one embodiment, each jet orifice of the plurality of jet orifices 612 has an orifice diameter D, and the plurality of jet orifices 612 are aligned in a common plane at height $H_{jet}$ from the surface to be cooled, with height $H_{jet}$ being in a range of 1-5 times orifice diameter D of the plurality of jet orifices (and more specifically, in one example, in a range of 2-3 times orifice diameter D). First surface 610 of jet orifice plate 600 is disposed at height $H_{plate}$ from the surface to be cooled. In one example, height $H_{plate}$ is at least 4 times orifice diameter D of the plurality of jet orifices. Thus, the plurality of jet orifice structures are configured to place the plurality of jet orifices at a height $H_{jet}$ significantly lower than that of the base height $H_{plate}$ of the lower surface 610 of the jet orifice plate. In one specific example, height $H_{jet}$ is approximately 2 times orifice diameter D, and height $H_{plate}$ is approximately 5 times orifice diameter D, resulting in height $H_{plate}$ being at least 2 times greater than height $H_{jet}$.

The jet orifice plate concepts described above with reference to the embodiment of FIGS. 6 & 7 can be applied in various applications. The specific embodiment of FIGS. 6 & 7 is depicted, by way of example only. Further, in one embodiment, the jet orifice plate of FIGS. 6 & 7 is employed in a direct impingement cooled electronics module, such as depicted and described above with reference to FIGS. 1-4A.

Figure 8:
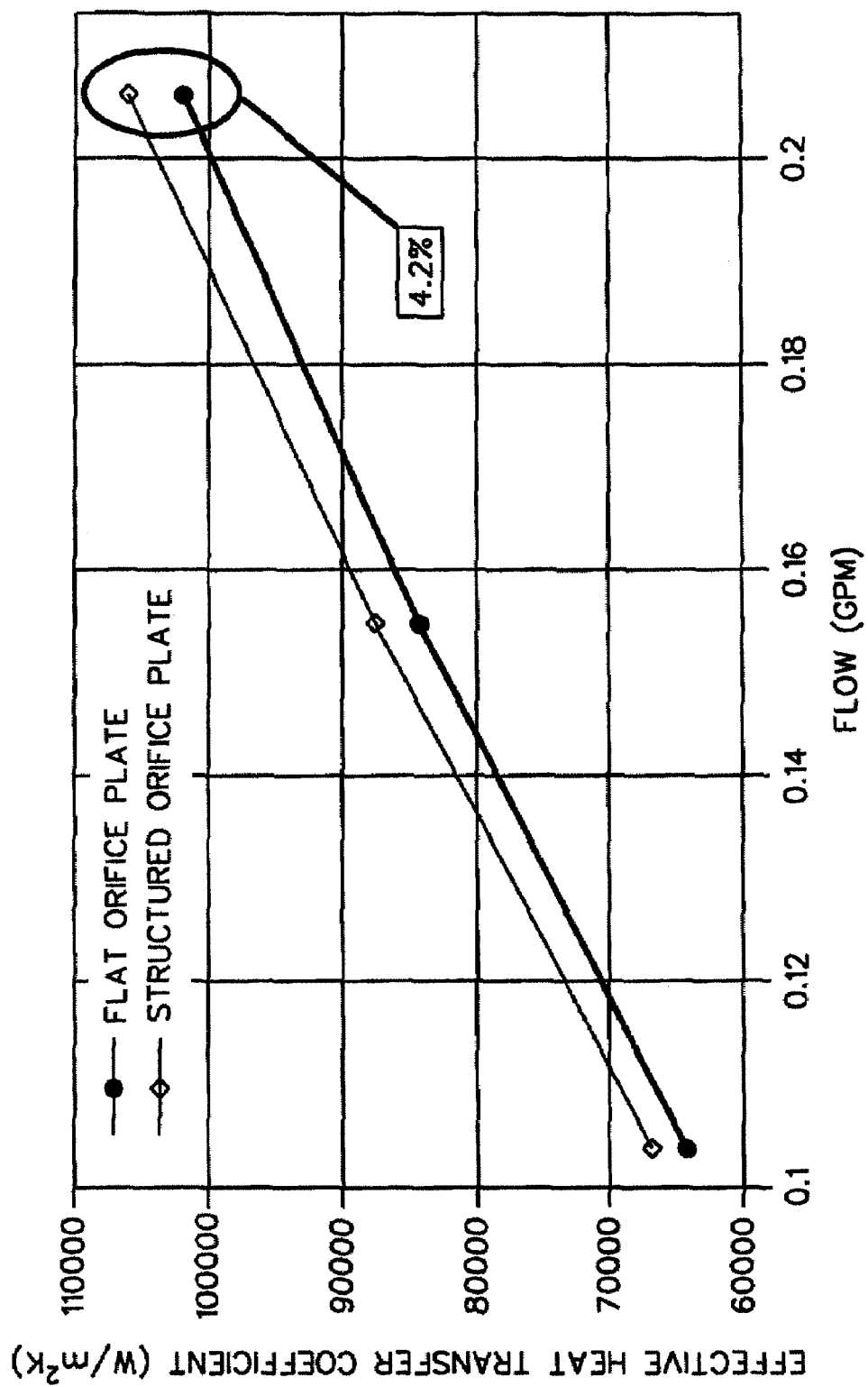
FIG. 8 is an exemplary graph of effective heat transfer versus coolant flow rate for a flat jet orifice plate such as depicted in FIGS. 3-4A and a structured jet orifice plate such as depicted in FIGS. 6 & 7, in accordance with an aspect of the present invention.
Figure 9:
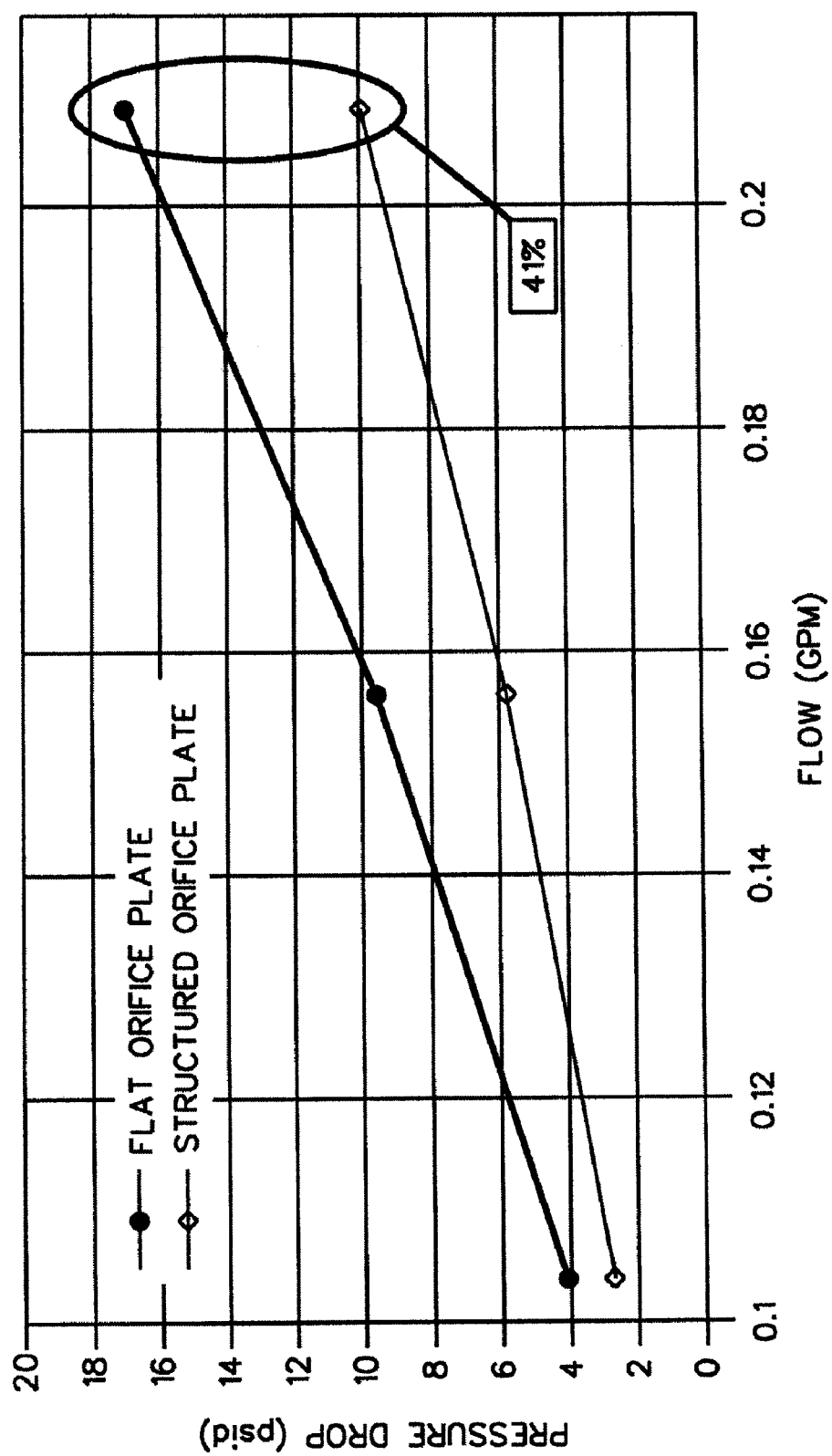
FIG. 9 is an exemplary graph of pressure drop versus coolant flow rate for the flat orifice jet plate of FIGS. 3-4A and the structured jet orifice plate of FIGS. 6 & 7, in accordance with an aspect of the present invention.

A comparative computational fluid dynamics (CFD) conjugate analysis was undertaken to assess the thermal and fluid behavior of a flat jet orifice plate (FIGS. 3A-4A) compared with a structured jet orifice plate (FIGS. 6 & 7). The models incorporated an 8.1 mm×8.1 mm×0.78 mm thick silicon die with an applied uniform heat flux of 250 W/cm² to the device side of the chip (opposite to the back surface where the jet impingement is to occur). Each jet orifice plate was assumed to have 0.150 mm diameter D orifices, a jet-to-impingement surface height of 2 jet orifice diameters D, and a pitch of 0.9 mm. $H_{plate}$ for the structured jet orifice plate was set at 5 jet orifice diameters D. FIG. 8 shows a comparison of the effective heat transfer coefficient for coolant flow rate for the flat jet orifice plate compared with the structured jet orifice plate. As depicted, analysis shows a 4.2% increase in effective heat transfer coefficient on the surface to be cooled for the structured jet orifice plate over that of the flat orifice plate. More significantly, FIG. 9 depicts pressure drop versus coolant flow rate for the flat jet orifice plate compared with the structured jet orifice plate. As shown, the structured jet orifice plate in this example has a 41% decrease in pressure drop over the flat jet orifice plate.

As briefly noted, the structured jet orifice plate described above in connection with FIGS. 6 & 7 could be employed in a two-phase coolant approach. In a two-phase approach, boiling jets of coolant will result in the generation of vapor leading to a significant increase in specific volume, velocity, and therefore pressure drop. The coolant effluent removal regions provide flow space for the generated vapor to escape the impingement surface and exit to the periphery of the electronic component without adversely effecting the thermal performance or the flow fields either in the center region or the peripheral region of the electronic component.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A cooling apparatus comprising:

a manifold structure comprising a jet orifice plate for injecting coolant onto a flat surface to be cooled when the cooling apparatus is employed to cool at least one electronic component, wherein the flat surface to be cooled comprises a surface of the at least one electronic component;

wherein the jet orifice plate comprises a plurality of jet orifices for directing coolant at the surface to be cooled, the jet orifice plate being configured with a plurality of jet orifice structures, each jet orifice structure projecting from a first surface of the jet orifice plate towards the surface to be cooled when the cooling apparatus is employed to cool the at least one electronic component, each jet orifice structure including a respective jet orifice of the plurality of jet orifices, and wherein the plurality of jet orifice structures are sized and spaced to define coolant effluent removal regions therebetween which facilitate removal of coolant effluent from over a center region of the at least one electronic component to a peripheral region thereof when the cooling apparatus is employed to cool the at least one electronic component, thereby reducing coolant pressure drop across the jet orifice plate;

wherein the jet orifice plate comprises a stamped, unitary base plate of uniform thickness with the plurality of jet orifice structures projecting across the first surface of the jet orifice plate, and wherein the jet orifice structures have a common geometrical configuration; and wherein the common geometrical configuration is a conical configuration, and wherein a second surface of the jet orifice plate comprises a plurality of funnels formed by the plurality of jet orifice structures of conical configuration projecting from the first surface of the jet orifice plate, each funnel directing coolant towards a respective jet orifice of the plurality of jet orifice structures for jet impingement on the surface to be cooled.

2. The cooling apparatus of claim 1, wherein each jet orifice of the plurality of jet orifices has an orifice diameter D, and wherein the plurality of jet orifices are aligned in a common plane disposed at a height $H_{jet}$ from the surface to be cooled when the cooling apparatus is employed to cool the at least one electronic component, wherein height $H_{jet}$ is in a range of 1-5 times orifice diameter D of the plurality of jet orifices.

3. The cooling apparatus of claim 1, wherein each jet orifice of the plurality of jet orifices has an orifice diameter D, and wherein the first surface of the jet orifice plate in the coolant effluent removal regions is spaced a height $H_{plate}$ from the surface to be cooled when the cooling apparatus is employed to cool the at least one electronic component, and wherein height $H_{plate}$ is at least 4 times orifice diameter D of the plurality of jet orifices.

4. The cooling apparatus of claim 3, wherein the plurality of jet orifices are aligned in a common plane disposed at a height $H_{jet}$ from the surface to be cooled when the cooling apparatus is employed to cool the at least one electronic component, and wherein height $H_{plate}$ is at least 2 times height $H_{jet}$, the jet orifice plate is fabricated of stainless steel, copper, or tungsten, and the at least one electronic component comprises an integrated circuit chip, wherein the surface to be cooled includes a back surface of the integrated circuit chip.

5. The cooling apparatus of claim 1, wherein the at least one component includes at least one integrated circuit chip, and the flat surface to be cooled comprises a back surface of the at least one integrated circuit chip.

6. The cooling apparatus of claim 5, wherein each funnel of the plurality of funnels is positioned adjacent to at least one other funnel of the plurality of funnels, the adjacent funnels being separated by approximately the uniform thickness of the stamped, unitary base plate.

7. The cooling apparatus of claim 1, wherein the coolant effluent removal regions are sized to prevent coolant effluent exhausting from over the center region of the at least one electronic component from perturbing flow fields of coolant being injected onto the surface to be cooled in at least one of the center region and the peripheral region of the at least one electronic component.

8. The cooling apparatus of claim 1, wherein the coolant is a two-phase coolant and wherein the coolant effluent removal regions facilitate exhausting of coolant vapor from over the center region of the at least one electronic component to the peripheral region thereof.

9. A direct impingement cooling module comprising:

a frame having a frame opening configured to align over a flat surface to be cooled of at least one electronic component, the flat surface to be cooled comprising a surface of the at least one electronic component;

a manifold disposed over the frame and having an inlet manifold opening and an outlet manifold opening, the inlet manifold opening being in fluid communication with a manifold inlet for supplying coolant, and the outlet manifold opening being in fluid communication with a manifold outlet for removing coolant effluent, the inlet manifold opening being aligned over the frame opening;

a jet orifice plate associated with the manifold and aligned under the inlet manifold opening, the jet orifice plate comprising a plurality of jet orifices for directing coolant at the at least one electronic component to be cooled, the jet orifice plate being a unitary plate configured with a plurality of jet orifice structures, each jet orifice structure projecting from a first surface of the jet orifice plate towards the at least one electronic component to be cooled, and wherein the plurality of jet orifice structures are sized and spaced to define coolant effluent removal regions therebetween which facilitate removal of coolant effluent from over a center region of the at least one electronic component to a peripheral region thereof, for removal through the outlet manifold opening of the manifold, thereby reducing coolant pressure drop across the jet orifice plate;

wherein the jet orifice plate is a stamped plate of uniform thickness with a plurality of jet orifice structures projecting across the first surface of the jet orifice plate, and wherein the jet orifice structures have a common geometrical configuration; and wherein the common geometrical configuration is a conical configuration, and wherein a second surface of the jet orifice plate comprises a plurality of funnels formed by the plurality of jet orifice structures of conical configuration projecting from the first surface of the jet orifice plate, each funnel directing coolant towards a respective jet orifice of the plurality of jet orifice structures for jet impingement on the at least one electronic component.

10. The direct impingement cooling module of claim 9, wherein the module is attached to a substrate supporting the at least one electronic component and wherein the at least one electronic component comprises at least one integrated circuit chip, the flat surface to be cooled comprising a back surface of the at least one integrated circuit chip, and the jet orifice plate is positioned to directly impinge coolant jets on the back surface of the at least one integrated circuit chip.

11. The direct impingement cooling module of claim 9, wherein each jet orifice of the plurality of jet orifices has an orifice diameter D, and wherein the plurality of jet orifices are aligned in a common plane disposed at a height $H_{jet}$ from the at least one electronic component, wherein height $H_{jet}$ is in a range of 1-5 times orifice diameter D of the plurality of jet orifices.

12. The direct impingement cooling module of claim 9, wherein each jet orifice of the plurality of jet orifices has an orifice diameter D, and wherein the first surface of the jet orifice plate in the coolant effluent removal regions is spaced a height $H_{plate}$ from the at least one electronic component to be cooled, and wherein $H_{plate}$ is at least 4 times orifice diameter D of the plurality of jet orifices.

13. The direct impingement cooling module of claim 12, wherein the plurality of jet orifices are aligned in a common plane disposed at a height $H_{jet}$ from the surface to be cooled when the cooling apparatus is employed to cool the at least one electronic component, and wherein height $H_{plate}$ is at least 2 times height $H_{jet}$, and wherein the jet orifice plate is a stamped plate fabricated of one of stainless steel, copper or tungsten.

14. The direct impingement cooling module of claim 9, wherein the jet orifice plate is bent in the shape of a container and forms at least one sidewall of the manifold.

15. The direct impingement cooling module of claim 9, wherein each funnel of the plurality of funnels is positioned adjacent to at least one other funnel of the plurality of funnels, the adjacent funnels being separated by approximately the uniform thickness of the stamped, unitary base plate.

16. The direct impingement cooling module claim 9, wherein the coolant effluent removal regions are sized to prevent coolant effluent exhausting from over the center region of the at least one electronic component from perturbing flow fields of coolant being injected towards the at least one electronic component in at least one of the center region and the peripheral region thereof.

17. The direct impingement cooling module of claim 9, wherein the coolant is a two-phase coolant and wherein the coolant effluent removal regions facilitate exhausting of coolant vapor from over the center region of the at least one electronic component to the peripheral region thereof.

* * * * *